United States Patent
Yazovitsky et al.

(10) Patent No.: US 10,884,855 B1
(45) Date of Patent: Jan. 5, 2021

(54) PERFORMANCE IN READING MEMORY CELLS AFFECTED BY NEIGHBORING MEMORY CELLS

(71) Applicant: Apple Inc., Cupertino, CA (US)

(72) Inventors: Eli Yazovitsky, Netanya (IL);
Yonathan Tate, Kfar Saba (IL);
Michael Tsohar, Givat Shumel (IL);
Naftali Sommer, Rishon Lezion (IL);
Eyal Gurgi, Petach Tikva (IL)

(73) Assignee: APPLE INC., Cupertino, CA (US)

( * ) Notice: Subject to any disclaimer, the term of this patent is extended or adjusted under 35 U.S.C. 154(b) by 6 days.

(21) Appl. No.: 16/535,115

(22) Filed: Aug. 8, 2019

(51) Int. Cl.
| | |
|---|---|
| *G06F 11/10* | (2006.01) |
| *G11C 29/52* | (2006.01) |
| *G11C 29/04* | (2006.01) |
| *H04L 1/00* | (2006.01) |
| *H03M 13/00* | (2006.01) |
| *H03M 13/11* | (2006.01) |
| *G06F 9/30* | (2018.01) |
| *G11C 11/408* | (2006.01) |

(Continued)

(52) U.S. Cl.
CPC ........ *G06F 11/1068* (2013.01); *G11C 11/409* (2013.01); *G11C 11/4074* (2013.01); *G11C 11/4085* (2013.01); *G11C 11/5628* (2013.01); *H03M 13/1111* (2013.01)

(58) Field of Classification Search
CPC ............. G06F 11/1068; G11C 11/4074; G11C 11/4085; G11C 11/409; G11C 11/5628; H03M 13/1111
See application file for complete search history.

(56) References Cited

U.S. PATENT DOCUMENTS

| | | | |
|---|---|---|---|
| 8,572,443 | B2 | 10/2013 | Hetzler et al. |
| 9,489,257 | B2 | 11/2016 | Ish-Shalom et al. |

(Continued)

OTHER PUBLICATIONS

Luo et al., "Architectural Techniques for Improving NAND Flash Memory Reliability", CMU-CS-18-101, Thesis submitted in partial fulfillment of the requirements for the degree of Doctor of Philosophy, School of Computer Science, Carnegie Mellon University, pp. 1-263, Aug. 12, 2018.

(Continued)

*Primary Examiner* — Guy J Lamarre
(74) *Attorney, Agent, or Firm* — Kligler & Associates Patent Attorneys Ltd

(57) ABSTRACT

A storage device includes circuitry and memory cells that store data in Np programming levels of threshold voltage values. The circuitry defines NRv threshold-sets, each includes Ns read thresholds that define Ns+1 zones, produces Ns readouts by reading, from a target WL, using the NS read thresholds, a target page that was stored encoded using an Error Correction Code (ECC), and produces a reference readout by reading the target page using optimal read thresholds. The circuitry identifies Np programming levels of memory cells in a neighbor WL for classifying target cells in the target WL into Np·NRv cell-groups. The circuitry calculates, per zone, Np LLR values, for the respective Np programming levels, based on the reference readout, the Ns readouts and the classification, assigns the LLR values to the target cells, and recovers the target page by applying to the assigned LLR values soft decoding for decoding the ECC.

23 Claims, 5 Drawing Sheets

(51) Int. Cl.
*G11C 11/4074* (2006.01)
*G11C 11/56* (2006.01)
*G11C 11/409* (2006.01)

(56) References Cited

U.S. PATENT DOCUMENTS

| | | |
|---|---|---|
| 9,490,023 B2 | 11/2016 | Sommer et al. |
| 10,340,951 B2* | 7/2019 | Symons .................. G06F 3/065 |
| 2011/0066902 A1* | 3/2011 | Sharon .................... G11C 29/50 |
| | | 714/721 |
| 2014/0223260 A1* | 8/2014 | Asadi .................. G11C 11/5642 |
| | | 714/763 |
| 2014/0281800 A1* | 9/2014 | Micheloni ......... H03M 13/3927 |
| | | 714/759 |
| 2015/0270007 A1* | 9/2015 | Sommer .................. G11C 7/04 |
| | | 365/185.09 |
| 2018/0349044 A1* | 12/2018 | Baum .................. G06F 11/108 |
| 2019/0035485 A1* | 1/2019 | Tate ....................... G11C 29/42 |

OTHER PUBLICATIONS

Luo et al., "Improving 3D NAND Flash Memory Lifetime by Tolerating Early Retention Loss and Process Variation", ACM on Measurement and Analysis of Computing Systems, vol. 2, issue 3, pp. 1-48, Dec. 2018.

* cited by examiner

PERFORMANCE IN READING MEMORY CELLS AFFECTED BY NEIGHBORING MEMORY CELLS

TECHNICAL FIELD

Embodiments described herein relate generally to data storage, and particularly to methods and systems for improving performance in reading memory cells affected by neighboring memory cells.

BACKGROUND

A memory device such as a nonvolatile memory may suffer degradation in readout performance for various reasons. For example, readout performance may degrade due to applying a large number of programming and erase cycles, device aging, a temperature difference between programming and reading, retention drift and the like.

Methods for mitigating degradation in readout performance are known in the art. For example, U.S. Pat. No. 9,490,023 describes a method that includes storing data values in a group of memory cells that share a common isolating layer, by producing quantities of electrical charge representative of the data values at respective regions of the common isolating layer that are associated with the memory cells. A function, which relates a drift of the electrical charge in a given memory cell in the group to the data values stored in one or more other memory cells in the group, is estimated. The drift is compensated for using the estimated function.

U.S. Pat. No. 9,489,257 describes a method for data storage that includes reading storage values, which represent stored data, from a group of memory cells using read thresholds, and deriving respective soft reliability metrics for the storage values. The storage values are classified into two or more subgroups based on a predefined classification criterion. Independently within each subgroup, a subgroup-specific distribution of the storage values in the subgroup is estimated, and the soft reliability metrics of the storage values in the subgroup are corrected based on the subgroup-specific distribution. The stored data is decoded using the corrected soft reliability metrics.

U.S. Pat. No. 8,572,443 describes a method that includes writing monitor data to at least one block of a memory device having finite endurance and/or retention; reading the monitor data after a period of time; determining a retention behavior of the at least one block based on the reading; and outputting a result of the determining. A memory device according to one embodiment includes a plurality of memory blocks having finite endurance and/or retention, at least one of the blocks having monitor data written therein; and circuitry for addressing the blocks.

SUMMARY

An embodiment that is described herein provides a storage device, including circuitry and multiple memory cells. The multiple memory cells arranged in multiple Word Lines (WLs), and are configured to store data in Np programming levels of threshold voltage values. The circuitry is configured to define NRv threshold-sets, each of the threshold-sets includes Ns read thresholds that define Ns+1 zones of threshold voltage values for each respective threshold-set, to read a data page Ns times, from a target WL including multiple target memory cells for producing respective Ns readouts, each of the Ns readouts is read using one or more read thresholds respectively selected from the NRv threshold-sets, and the target page was encoded for storage using an Error Correction Code (ECC). The circuitry is further configured to identify Np neighbor programming levels to which the memory cells in one or more neighbor WLs to the target WL, are programmed, and make a classification of the target memory cells in the target WL into a plurality of cell-groups, each of the cell-groups is associated with (i) a respective threshold-set and (ii) a respective neighbor programming level, to calculate for each zone Np Log likelihood Ratio (LLR) values, for the respective Np neighbor programming levels, to assign the calculated LLR values to the target memory cells whose threshold voltages fall in that zone, and to recover the target page by applying to the assigned LLR values soft decoding for decoding the ECC.

In some embodiments, the circuitry is configured to produce a reference readout by reading the target page from the target WL using one or more read thresholds configured for minimum readout errors, and to calculate the Np LLR values based on the reference readout, on the Ns readouts, and on the classification into the cell-groups. In other embodiments, the circuitry is configured to estimate for each cell-group and zone (i) a N0 count that evaluates a number of the target memory cells in the cell-group and zone that read a logical '0' value, and (ii) a N1 count that evaluates a number of the target memory cells in the cell-group and zone that read a logical '1' value, and calculate a LLR value for each zone and neighbor programming level as log(N0/N1). In yet other embodiments, for inner zones of a given threshold-set, each inner zone is defined by both an upper read threshold and a lower read threshold, the circuitry is configured to estimate initial N0 counts and initial N1 counts for each of the cell-groups, to model first and second Gaussian distributions for the threshold voltage distributions of the target memory cells corresponding to the given threshold-set and cell-group, based respectively on the estimated initial N0 counts and the initial N1 counts of the cell-group over the inner zones, and to evaluate N0 counts and N1 counts using the respective first and second Gaussian distributions. In yet further other embodiments, the circuitry is configured to model at least tails of the threshold voltage distributions of the target memory cells corresponding to the given threshold-set and cell-group, by estimating first and second Laplacian distributions, based respectively on the initial N0 counts and the initial N1 counts over the inner zones, and to update the N0 counts and the N1 counts corresponding to outer zones of the given threshold-set, each outer zone is defined by a single read threshold, based on the respective first and second Laplacian distributions.

In an embodiment, the circuitry is configured to estimate the initial N0 counts and the initial N1 counts by calculating syndrome weight values and readout weight values for each cell-group based on the respective readouts, calculating count differences (N1−N0) and count sums (N1+N0) using the syndrome weights and the readout weights, respectively, and calculating the initial N0 and N1 counts based on the count differences and on the count sums. In another embodiment, the circuitry is configured to estimate the first Gaussian distribution by defining a cost function of a mean parameter and of a variance parameter of a Gaussian distribution, the cost function depends on the initial N0 counts of a cell-group over the inner zones, and to select an optimal mean parameter and an optimal variance parameter that together minimize the cost function. In yet another embodiment, the circuitry is configured to estimate for each zone (i) an unsplit N0 count that evaluates a number of the target memory cells in the zone that read a logical '0' value, and (ii) an unsplit N1 count that evaluates a number of the target memory cells in the zone that read a logical '1' value, to model based on the unsplit N0 count and the unsplit N1 count respective first and second unsplit Gaussian threshold voltage distributions corresponding to the given threshold-set, to model first and second split Gaussian threshold voltage distributions corresponding to the given threshold-set and to the respective cell-groups, by evaluating shift values between a mean value of the unsplit Gaussian distribution and respective mean values of the split Gaussian distributions, and to estimate the N0 and N1 counts using the split Gaussian distributions.

In some embodiments, the circuitry is configured to evaluate a given shift value in a given zone by (i) estimating an unsplit read threshold for reading the target memory cells corresponding to the zone with minimum readout errors, (ii) estimating a split read threshold for reading the target memory cells corresponding to the given zone and cell-group with minimum readout errors, and (iii) estimating the given shift value as a difference between the unsplit read threshold and the split read threshold. In other embodiments, the circuitry is configured to estimate one or more of the unsplit read threshold and the split read threshold, by calculating multiple syndrome weight values over multiple respective zones, fitting a predefined scalar function to the multiple syndrome weight values, and estimating a read threshold value for which the scalar function is minimized.

In an embodiment, the memory cells experience retention loss at a rate that depends on the threshold voltage programmed to a neighbor memory cell. In another embodiment, the circuitry is configured to estimate respective shift values between a threshold voltage distribution of the target memory cells and each of threshold voltage distributions of part of the target memory cells belonging to each of the respective cell-groups, and to calculate the LLR values for each zone and neighbor programming level based on the estimated shift values.

There is additionally provided, in accordance with an embodiment that is described herein, a method for data storage, including, in a storage device that includes multiple memory cells arranged in multiple Word Lines (WLs), the memory cells store data in Np programming levels of threshold voltage values, defining NRv threshold-sets, and each of the threshold-sets includes Ns read thresholds that define Ns+1 zones of threshold voltage values for each respective threshold-set, reading a data page Ns times, from of a target WL including multiple target memory cells, for producing respective Ns readouts, each of the Ns readouts is read using one or more read thresholds respectively selected from the NRv threshold-sets, and the target page was encoded for storage using an Error Correction Code (ECC). A reference readout is produced by reading the target page from the target WL using one or more read thresholds configured for minimum readout errors. Np neighbor programming levels to which the memory cells in one or more neighbor WLs to the target WL are programmed, are identified, and a classification of the target memory cells in the target WL into a plurality of cell-groups is made, so that each of the cell-groups is associated with (i) a respective threshold-set and (ii) a respective neighbor programming level. For each zone, Np Log likelihood Ratio (LLR) values are calculated, for the respective Np neighbor programming levels. The calculated LLR values are assigned to the target memory cells whose threshold voltages fall in that zone, and the target page is recovered by applying to the assigned LLR values soft decoding for decoding the ECC.

There is additionally provided, in accordance with an embodiment that is described herein, a storage device, including circuitry and multiple memory cells. The multiple memory cells are arranged in multiple Word Lines (WLs), and are configured to store data in Np programming levels of threshold voltage values. The circuitry is configured to read a neighbor page from a neighbor WL of a target WL that stores a target page encoded using ECC to be read, and classify the memory cells in the target WL into multiple cell-groups based on the Np neighbor programming levels to which the memory cells in the neighbor WL are programmed, to calculate multiple respective sets of optimal read thresholds for each of the multiple cell-groups, to read the target WL using each of the multiple sets of the optimal read thresholds, and combine bits read from the memory cells of the respective cell-groups to produce a combined page, to assign LLR values to the bits of the combined page per zone and neighbor programming level, and to recover the target page by applying to the bits of the combined page, with the assigned LLR values, soft decoding for decoding the ECC.

In some embodiments, the circuitry is configured to hold predefined LLR values per zone and neighbor programming level in a table, and to assign the LLR values by retrieving the predefined LLR values from the table. In other embodiments, the circuitry is configured to assign the LLR values, by calculating the LLR values for bits read from the memory cells in the cell-groups.

There is additionally provided, in accordance with an embodiment that is described herein, a method for data storage, including, in a storage device that includes multiple memory cells arranged in multiple Word Lines (WLs), the memory cells store data in Np programming levels of threshold voltage values, reading a neighbor page from a neighbor WL of a target WL that stores a target page encoded using ECC to be read, and classifying the memory cells in the target WL into multiple cell-groups based on the Np neighbor programming levels to which the memory cells in the neighbor WL are programmed. Multiple respective sets of optimal read thresholds are calculated for each of the multiple cell-groups. The target WL is read using each of the multiple sets of the optimal read thresholds, and bits read from the memory cells of the respective cell-groups are combined to produce a combined page. LLR values are assigned to the bits of the combined page per zone and neighbor programming level. The target page is recovered by applying to the bits of the combined page, with the assigned LLR values, soft decoding for decoding the ECC.

These and other embodiments will be more fully understood from the following detailed description of the embodiments thereof, taken together with the drawings in which:

DETAILED DESCRIPTION OF EMBODIMENTS

Overview

Figure 1:
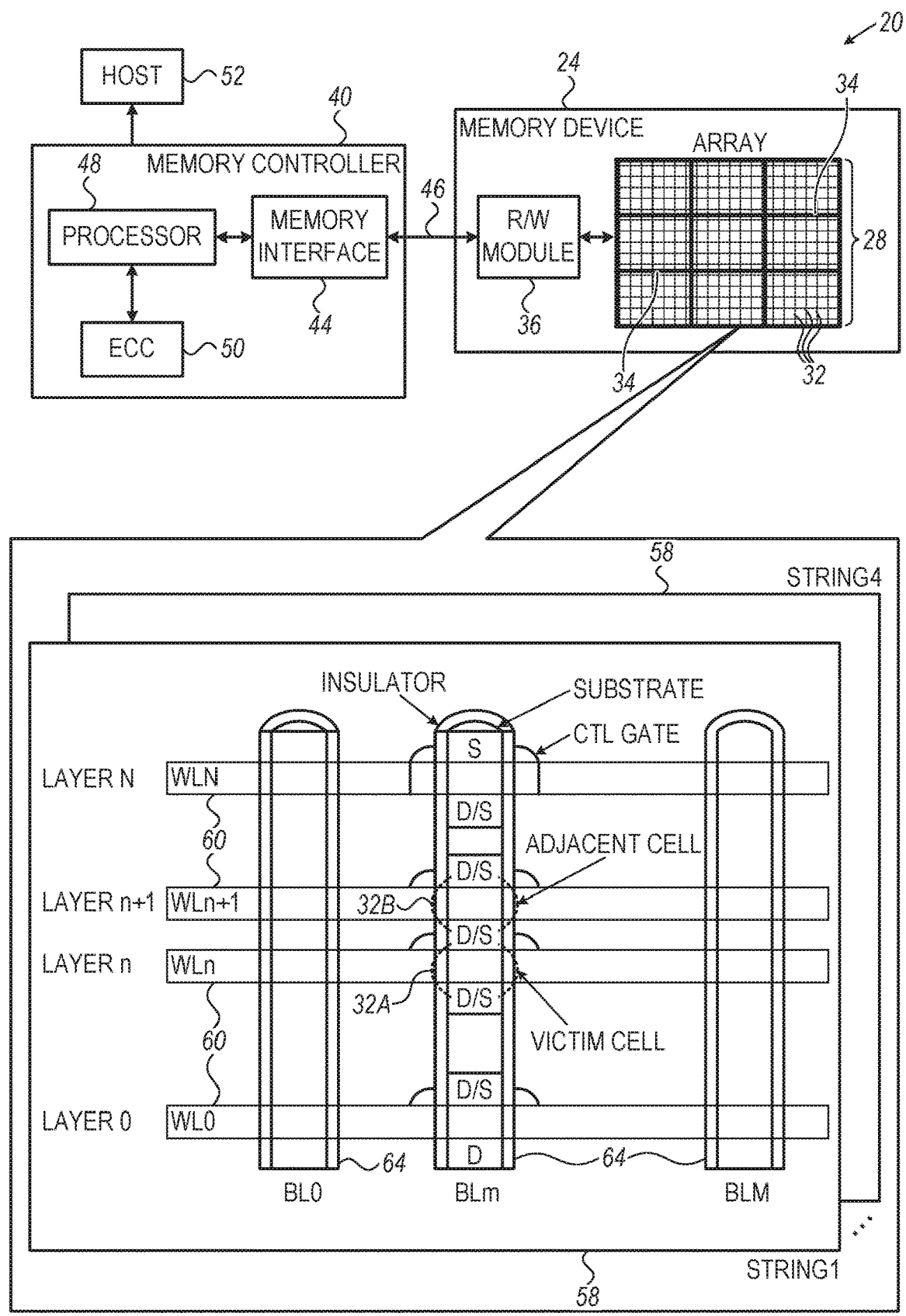
FIG. 1 is a block diagram that schematically illustrates a memory system, in accordance with an embodiment that is described herein.

In various storage systems a memory controller is coupled to a memory array comprising multiple memory cells. The memory controller stores data by programming the memory cells to respective programming levels having analog values such as threshold voltages. In reading stored data, the memory controller sets one or more read thresholds for sensing the threshold voltages of the memory cells. Factors that may degrade readout performance include, for example, programming and erase cycles, aging, temperature difference between programming and reading, retention drift and the like.

Embodiments that are described herein provide improved systems and methods for reading memory cells that are affected by neighboring memory cells.

In some embodiments, the memory controller stores a data page encoded using an Error Correction Code (ECC) and decodes the ECC of the encoded data when retrieved from memory, using a soft decoder. In the present context, the ECC is assumed to be defined using a predefined set of check equations. ECC of this sort comprises, for example, a Low-Density Parity-Check (LDPC) ECC.

In principle, the memory controller may perform soft decoding by assigning predefined soft metrics such as Log Likelihood Ratio (LLR) values to the respective bits of the encoded data page retrieved or to the respective memory cells. In such an implementation, the values of the soft metrics (e.g., LLRs) are typically estimated offline by averaging soft values over a large number of devices and scenarios, and the estimated LLR values are stored in LLR tables. Upon reading, LLR values are retrieved from the LLR tables and assigned to the page bits. Using such predefined soft metrics is typically suboptimal for reading a specific group of memory cells, especially when the memory cells being read are affected by neighbor memory cells.

In some of the disclosed techniques, instead of using average predefined LLR values that were stored beforehand in LLR tables, LLR values are calculated dynamically upon reading, and are assigned to the read bits for soft decoding. In the dynamic calculation of the LLR values, no prior knowledge on the LLR values is assumed. In some embodiments, calculating the LLR dynamically depends on the programming levels to which neighbor memory cells are programmed. Since the LLR values are calculated for reading a specific group of target memory cells, soft decoding using these calculated LLR values is much more likely to succeed compared to using predefined LLR values.

Consider a storage device comprising circuitry coupled to an array of multiple memory cells arranged in multiple Word Lines (WLs). The circuitry stores data by programming each memory cell to one of Np predefined programming levels. For reading data, the circuitry defines NRv threshold-sets, wherein each of the threshold-sets comprises Ns read thresholds that define Ns+1 zones of threshold voltage values for each respective threshold-set. The total number of zones is given by NRv·(Ns+1).

In some embodiments, the circuitry reads from a target WL comprising multiple target memory cells a target data page encoded using an ECC. The circuitry reads the target data page Ns times for producing Ns respective readouts, wherein each readout is read using a respective set of NRv read thresholds respectively selected from the NRv threshold-sets. The circuitry additionally produces a reference readout by reading the target page from the target WL using read thresholds configured for minimum readout errors. In taking into consideration the neighbor memory cells, the circuitry reads a neighbor WL, identifies Np neighbor programming levels to which the memory cells in the neighbor WL are programmed, and makes a classification of the target memory cells in the target WL into Np·NRv cell-groups. Each of the cell-groups is associated with (i) a respective threshold-set and (ii) a respective neighbor programming level.

For each zone among the NRv·(Ns+1) zones, the circuitry dynamically calculates Np Log likelihood Ratio (LLR) values, an LLR value for each respective neighbor programming level, based on the reference readout, on the Ns readouts and on the classification into the cell-groups. The circuitry assigns the dynamically calculated LLR values to the target memory cells whose threshold voltages fall in that zone, based on the classification of the target memory cells into the cell-groups, and recovers the target page by applying to the assigned LLR values soft decoding for decoding the ECC.

In some embodiments, the circuitry estimates for each cell-group and zone (i) a N0 count that evaluates a number of the target memory cells in the cell-group and zone that read a logical '0' value, and (ii) a N1 count that evaluates a number of the target memory cells in the cell-group and zone that read a logical '1' value. The circuitry calculates a LLR value for each zone and neighbor programming level as log(N0/N1).

In some embodiments, for inner zones of a given threshold-set, defined by both an upper read threshold and a lower read threshold, the circuitry estimates initial N0 counts and initial N1 counts for each of the cell-groups. The circuitry models Gaussian threshold voltage distributions for each threshold-set and cell-group, based on the initial N0 and N1 counts over multiple inner zones, and evaluates the N0 counts and the N1 counts for LLR calculation using the modeled Gaussian distributions.

The circuitry may estimate the Gaussian distributions in various ways. In some embodiments, the circuitry estimates the mean and variance parameters of the Gaussian distributions by minimizing a suitable cost function. In other embodiments, the circuitry estimates the mean and variance parameters by estimating shift values in the mean values estimated with and without classification into the cell-groups. In an embodiment, the circuitry estimates such a shift value by calculating a difference between optimal read thresholds estimated with and without classification of the memory cells into the cell-groups.

In an embodiment, the circuitry improves the Gaussian-based N0 and N1 counts, by estimating Laplacian distributions. The circuitry estimates the Laplacian distributions based on the initial N0 and N1 counts and corrects the Gaussian-based N0 and N1 counts using the estimated Laplacian distributions, at least for zones corresponding to tails of the Gaussian distributions.

In some embodiments, improving readout performance is based on calculating optimal read thresholds for cell-groups corresponding to the neighbor programming levels. In these embodiments, the circuitry reads a neighbor page from a neighbor WL of a target WL that stores a target page encoded using ECC to be read, and classifies the memory cells in the target WL into multiple cell-groups based on the Np neighbor programming levels to which the memory cells in the neighbor WL are programmed. The circuitry calculates multiple respective sets of optimal read thresholds for each of the multiple cell-groups, reads the target WL using each of the multiple sets of the optimal read thresholds, and combines bits read from the memory cells of the respective cell-groups to produce a combined page. The circuitry assigns LLR values to the bits of the combined page per zone and neighbor programming level, and recovers the target page by assigning to the bits of the combined page, with the assigned LLR values, soft decoding for decoding the ECC. In such embodiments, the LLR values may be retrieved from a predefined table or calculated dynamically.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in analog memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC).

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds.

Memory system 20 comprises a memory controller 40 that performs storage and retrieval of data in and out of memory device 24. Memory controller 40 comprises a memory interface 44 for communicating with memory device 24, a processor 48, and an Error Correction Code (ECC) module 50. The memory controller communicates with the memory device via memory interface 44 over a communication link 46. Communication link 46 may comprise any suitable link or communication bus, such as, for example, a PCIe bus.

In some embodiments, the memory controller communicates with the memory device storage commands such as erase, program and read commands. The memory controller may communicate with the memory device control commands, e.g., for configuring read thresholds. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a Code Word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities. In the context of the present disclosure and in the claims, the term "optimal read thresholds" refers to read thresholds that are positioned to achieve a minimal number of readout errors over a range of the threshold voltage axis.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In the example of FIG. 1, the memory cells are arranged in a Three-Dimensional (3D) configuration in which multiple layers of silicon are stacked vertically. In the present example, the memory cells in the 3D configuration are arranged in multiple strings 58.

In an example configuration of memory array 28, as depicted in the lower part of FIG. 1, memory cells 32 (in a string) are arranged in multiple rows and columns, and each memory cell comprises a charge trap transistor. The control gates of the transistors in each row are connected by word lines 60, and the sources and drains of the transistors in each column are connected by bit lines 64 so that the source and drain of neighbor transistors along the bit line are interconnected. Memory cells 32 of a bit line are stacked vertically, and the bit line connects the cells belonging to different respective layers. Note that all of the memory cells along the bit line share the same charge trap insulator. In a 3D configuration each word line is shared among multiple strings.

As will be described below, a value read for a given memory cell 32A in a given word line (denoted WLn) may depend on the value stored in an adjacent memory cell 32B in the same bit line.

In an alternative configuration of array 28, e.g., in a Two-Dimensional (2D) configuration, memory cells 32 are arranged in multiple rows and columns, and each memory cell comprises a floating-gate transistor. The gates of the transistors in each row are connected by word lines, and the sources of the transistors in each column are connected by bit lines.

The memory array is typically divided into multiple memory pages, i.e., groups of memory cells that are programmed and read simultaneously from a common word line.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks, also referred to as "memory blocks" (34). In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit-per-cell devices would have 384 data pages per block. A typical three-dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

Example Nominal Threshold Voltage Distributions of Memory Cells

Figure 2:
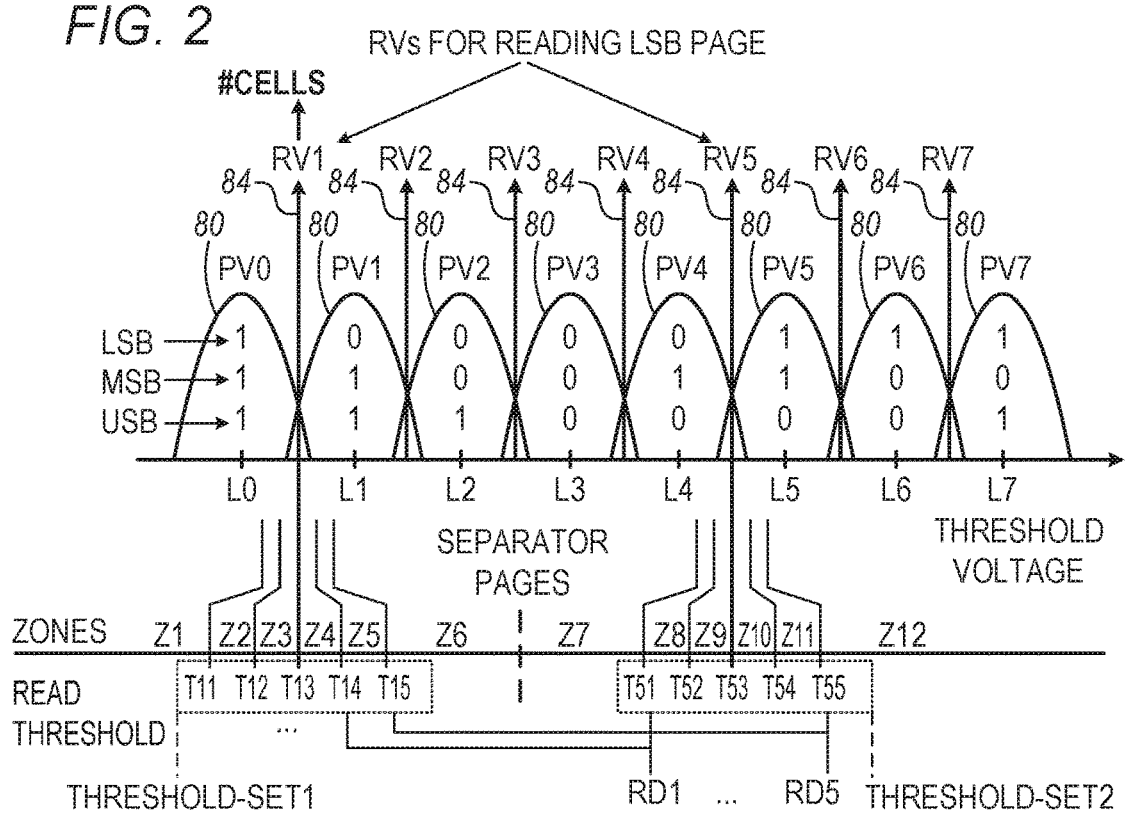
FIG. 2 is a diagram the schematically illustrates threshold voltage distributions in a TLC memory device, and zones along the threshold voltage axis defined by multiple read thresholds.

FIG. 2 is a diagram the schematically illustrates threshold voltage distributions in a TLC memory device, and zones along the threshold voltage axis defined by multiple read thresholds. In a TLC device, the memory controller programs data in eight programming levels that are referred to herein as L0 ... L7. The number of programming levels is denoted "Np" and in the present example Np=8.

FIG. 2 depicts threshold voltage distributions 80 corresponding to respective programming levels L0 ... L7. The level L0 is an erasure level whose threshold voltage distribution is denoted PV0. The threshold voltage distributions corresponding to L1 ... L7 are denoted PV1 ... PV7, respectively.

In some embodiments, the memory controller stores data to the memory cells in units of a data page. In the present example, the memory controller stores three data pages to a group of memory cells that typically belong to a common word line. The three data pages are denoted Least Significant Bit (LSB), Most Significant Bit (MSB) and Upper Significant Bit (USB) data pages, for the respective lower, middle and upper bit-significance data pages.

The memory controller may encode bits for storage into programming levels in various ways. In some embodiments, the memory controller encodes 3-bit groups into the eight programming levels using a Gray code as given in Table 1.

TABLE 1

Gray code used for mapping between
bit-triples and programming levels

| PAGE/LEVEL | L0 | L1 | L2 | L3 | L4 | L5 | L6 | L7 |
|---|---|---|---|---|---|---|---|---|
| LSB | 1 | 0 | 0 | 0 | 0 | 1 | 1 | 1 |
| MSB | 1 | 1 | 1 | 0 | 1 | 1 | 0 | 0 |
| USB | 1 | 1 | 1 | 0 | 0 | 0 | 0 | 1 |

To read a data page stored in the non-volatile memory, the memory controller (or R/W unit) typically sets one or more read thresholds 84 and using the R/W unit senses whether the threshold voltages of the memory cells being read are below or above the read thresholds. For example, in FIG. 2, to read a LSB page, the memory controller sets read thresholds denoted RV1 and RV5. The memory controller sets RV1 at about a mid-point between threshold voltage distributions PV0 and PV1. Similarly, the memory controller sets RV5 to a mid-point between threshold voltage distributions PV4 and PV5. In a similar manner, to read the MSB page, the memory controller sets read thresholds RV2, RV4 and RV6, and to read a USB page the controller sets read thresholds RV3 and RV7.

In some embodiments, the controller configures the relevant RV thresholds for minimum readout errors. The memory controller determines an optimal setting for the RV read thresholds using any suitable acquisition process. For example, for setting optimal read thresholds in reading a LSB page, the memory controller may perform multiple read operations at multiple respective positions of the read thresholds at the vicinity of RV1 and RV5 to produce multiple respective readouts, and position RV1 and RV5 based on the number of errors in the respective readouts.

In some embodiments, the memory controller encodes input data (e.g., a data page) into a code word (CW) using ECC 50 and stores the CW in memory device 24. Upon reading, the memory controller retrieves the CW from memory and decodes the retrieved CW using ECC 50 to recover the input data.

In some embodiments, the memory controller decodes the ECC of the encoded data page using soft decoding techniques, e.g., by assigning to the readout bits respective reliability metrics such as Log Likelihood Ratio (LLR) metrics. The LLR value assigned to a given bit in the readout depends on a zone (the zone includes information of the relevant threshold-set) along the threshold voltage axis to which the threshold voltage of the relevant memory cell belongs, and on the programming level of a neighbor memory cell to the memory cell from which the bit was read. In some embodiments, a LLR value comprises a sign that specifies the bit value and a positive value that specifies a reliability measure of that bit.

In FIG. 2, the threshold voltage axis is divided into twelve zones denoted Z1 . . . Z12, which are related to reading a LSB page using read thresholds RV1 and RV5. In some embodiments, the memory controller defines multiple read thresholds that divide the threshold voltage axis into the multiple zones. In FIG. 2, zones Z1 . . . Z6 correspond to read threshold RV1 and are defined using read thresholds denoted T11 . . . T15. Zones Z7 . . . Z12 correspond to read threshold RV5 and are defined using read thresholds denoted T51 . . . T55. In general, read thresholds RVi, i=1 . . . 7 are considered nominal read thresholds that the memory controller configures for achieving optimal readout performance, e.g., a minimal number of readout errors. In the present example, for a given read threshold RVi, i=1 . . . 7, five read thresholds Ti1 . . . Ti5 are defined. In alternative embodiments, any other number of read thresholds per RVi, such as seven readout thresholds Ti1 . . . Ti7, can also be used. Further alternatively, different numbers of read thresholds can be used among the respective RVs.

The read thresholds associated with a given RV are referred to herein as a "threshold-set." In the example of FIG. 2, in reading an LSB page, read thresholds T11 . . . T15 are associated with a threshold-set denoted THRESHOLD-SET1, and thresholds T51 . . . T55 are associated with a threshold-set denoted THRESHOLD-SET2. In the description that follows the term RV is also used to refer to the threshold-set of read thresholds associated with that RV.

In reading from a target WL a data page of a given bit-significance value using multiple RVs, the processor differentiates among threshold-sets corresponding to different RVs by reading from same target WL one or more separator pages of other respective bit-significance values. In the example of FIG. 2, the memory controller reads a LSB page from a given WL, and differentiates between THRESHOLD-SET1 related to RV1 and THRESHOLD-SET2 related to RV5 by reading two separator pages, the MSB page and the USB page of the given WL.

In some embodiments, the memory controller reads a target data page from a target WL multiple times to produce multiple readout results. In the example of FIG. 2, the memory controller reads a LSB page five times using the read threshold pairs (T11, T51), (T12, T52), (T13, T53), (T14, T54) and (T15, T55) for producing five respective readouts denoted RD1 . . . RD5.

In some embodiments, the memory controller reads a target data page from a target WL while ignoring neighboring memory cells in adjacent WLs. In embodiments of this sort, the memory controller typically holds a respective predefined LLR value for each zone and assigns a LLR value associated with a given zone to memory cells in the target WL whose threshold voltages fall in the given zone. The memory controller then applies soft decoding to a vector of the assigned LLR values using ECC 50.

In principle, the memory controller may hold predefined LLR values (e.g., LLR tables), for translating the five values of each bit in RD1 . . . RD5 into respective LLR values. Using predefined LLR values for respective zones, however, are typically insufficiently accurate for real life situations, such as, when the voltage distributions shift due to various impairments.

As will be described below, in some embodiments, the memory controller calculates multiple LLR values for each zone, the multiple LLR values correspond to multiple respective programming levels of neighboring memory cells. The memory controller thus assigns to the memory cells in the target WL calculated LLR values that take into consideration the programming levels of the neighboring memory cells.

Threshold-Distribution Shifts Depending on
Programming Levels of Neighboring Memory Cells During the lifetime of a memory device, the memory cells may suffer from impairments of various types. For example, the threshold voltages to which the memory cells in one WL are programmed may be affected by the programming levels of neighboring memory cells in an adjacent WL. In an impairment that is referred to as "crosstalk" the threshold voltages of the memory cells in one WL are affected by the electrical field induced by memory cells in an adjacent WL.

Another type of impairment denoted "retention" refers to drifting of the analog values to which the memory cells are programmed, with time. A paper by Yixin. Luo et al., titled "Improving 3D NAND Flash Memory Lifetime by Tolerating Early Retention Loss and Process Variation," which was published, for example, in the Proceedings of the ACM on Measurement and Analysis of Computing Systems, volume 2, issue 3, December 2018, article number 37, describes a retention phenomenon according to which the rate of charge leakage from a Flash memory cell depends on the amount of charge stored in neighboring memory cells in the same bit line. A retention phenomenon of this sort may occur in certain types of 3D NVM devices, for example, 3D configurations in which charge trap memory cells share a common charge trap layer along the bit line. In such devices, the speed or rate of retention loss for a memory cell depends on the threshold voltage of an adjacent neighbor cell along the bit line.

Note that for memory devices that suffer from this type of retention, using dynamic calculation of LLRs (LLR per zone and per neighbor programming level) results in superior performance compared to using average LLR values pre-stored in tables, because of the time-varying nature and the dependence on neighbor programming level of this type of retention.

Figure 3:
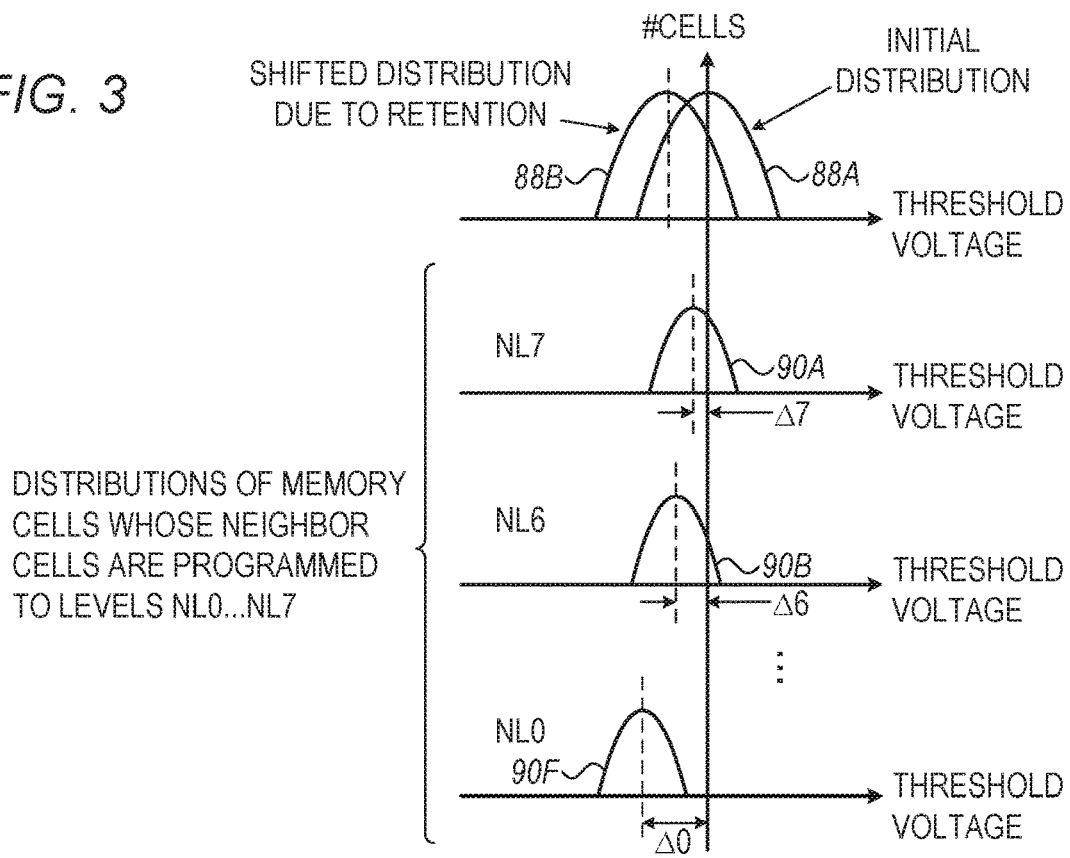
FIG. 3 is a diagram that schematically illustrates different shift values caused to threshold-distributions due to retention, depending on the program levels of neighbor memory cells, in accordance with an embodiment that is described herein.

FIG. 3 is a diagram that schematically illustrates different shift values caused to threshold-distributions due to retention, depending on the program levels of neighbor memory cells, in accordance with an embodiment that is described herein.

FIG. 3 depicts a threshold voltage distribution 88A and a shifted version 88B of this threshold voltage distribution due to retention. Distributions 88A and 88B correspond to a group of memory cells such as a WL or part of the WL used for storing a data page. The threshold voltages of the memory cells in the group are distributed initially as depicted by distribution 88A and after a retention period as depicted by distribution 88B.

Threshold voltage distributions 90 correspond to cell-groups comprising disjoint subgroups of the memory cells in the group. In some embodiments, the memory controller determines the cell-groups by classifying the memory cells in the group based on the multiple programming levels of neighboring memory cells. As such, the memory cells in the group whose respective neighboring cells (e.g., in the same bit line) are programmed to a given programming level belong to a common cell-group. In the present example, the memory device comprises a TLC device having Np=8 programming levels, and therefore the memory cells in the group are classified into eight respective cell-groups.

In FIG. 3, distributions 90A . . . 90F correspond to neighbor programming levels denoted NL7 . . . NL0, respectively. A threshold voltage distribution of a cell-group associated with a neighbor programming level NLn is shifted by a threshold voltage amount denoted $\Delta n$, relative to the center of the initial distribution 88A. In accordance with the retention phenomenon described above, in which the rate of charge leakage from a memory cell depends on the programming level of a neighboring memory cell, the shift values are ordered so that $\Delta n > \Delta n+1$, for n=0 . . . 6.

As will be described in detail below, in some embodiments, the memory controller models threshold voltage distributions 90A . . . 90F as Gaussian distributions. The memory controller uses the modeled Gaussian distributions to estimate cell counts N0 and N1 reading '0' or '1' logical values in multiple zones of the threshold voltage axis and for each of the neighbor programming levels. The memory controller then calculates LLR values based on the N0 and N1 counts.

Although the description of FIG. 3 refers mainly to shifts caused to programming levels of target memory cells being read due to retention loss whose severity depends on the programming levels of neighboring memory cells, the embodiments that will be described below are applicable to other types of impairments in which memory cells are affected by neighboring memory cells such as crosstalk.

Figure 4:
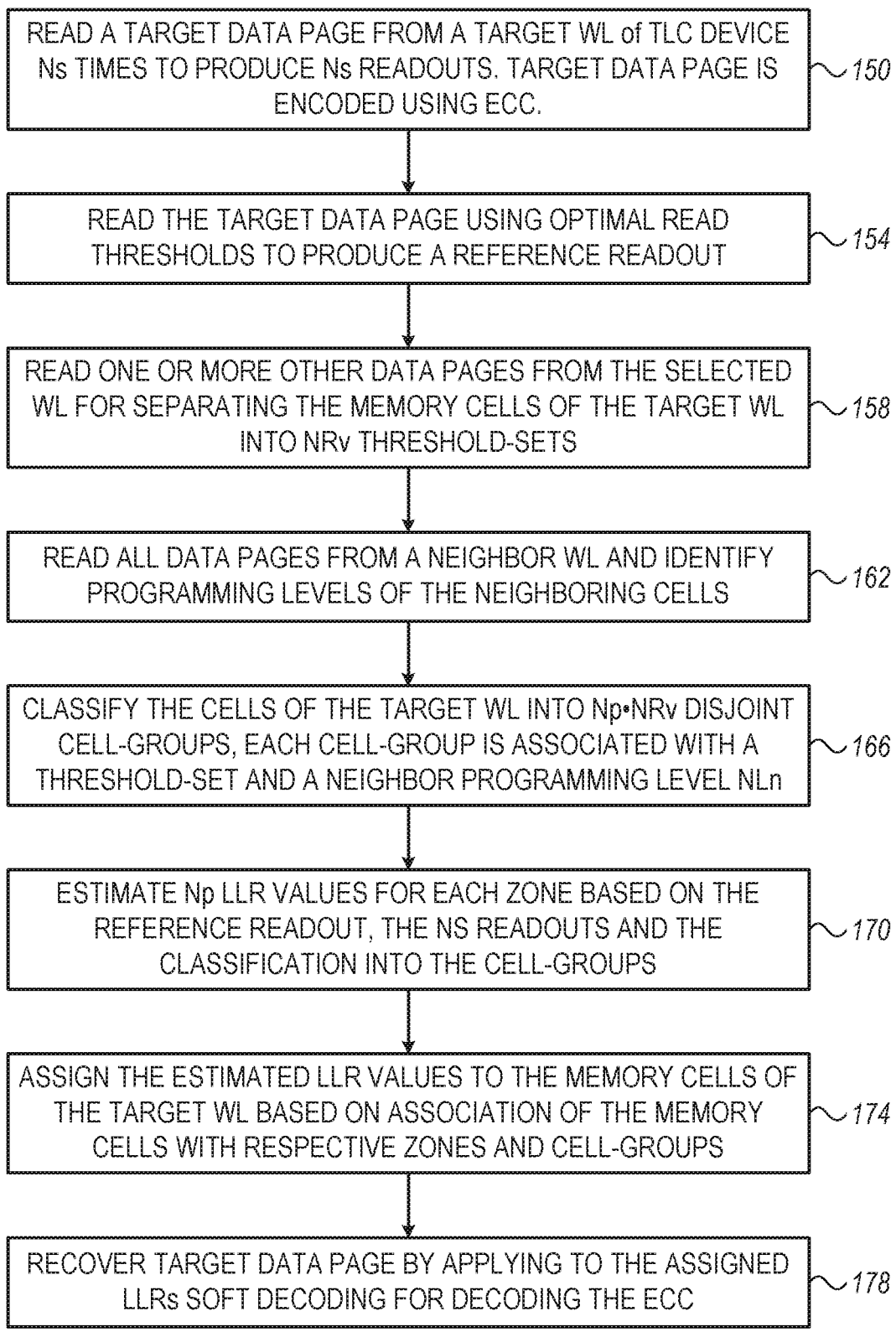
FIG. 4 is a flow chart that schematically illustrates a method for reading a group of memory cells that are affected by programming levels of neighboring memory cells, in accordance with an embodiment that is described herein.

Improved Reading Performance by Calculating LLR Values Depending on Programming Levels of Neighbor Memory Cells FIG. 4 is a flow chart that schematically illustrates a method for reading a group of memory cells that are affected by programming levels of neighboring memory cells, in accordance with an embodiment that is described herein. The method will be described as executed by processor 48 of memory controller 40 in memory system 20. In the present example, memory controller 40 stores data in memory device 24 comprising a TLC device.

In describing the method an assumption is made that processor 48 has defined NRv threshold-sets for reading a data page, wherein each of the threshold-sets comprises Ns read thresholds that define Ns+1 zones of threshold voltage values for each respective threshold-set. For example, as described above with reference to FIG. 2, in reading a LSB data page from a TLC device, the processor defines threshold-sets RV1 and RV5, and the number of read thresholds per a threshold-set is Ns=5, in an embodiment.

Although the method will be described mainly for reading a LSB data page, the method is similarly applicable for reading data pages of other bit-significance value. Moreover, the method is applicable to any suitable coding of bits to programming level other than the Gray code depicted in FIG. 2, and for any suitable memory cells other than TLC.

The method begins, at a multi-read step 150, with processor 48 reading a target data page from a target WL of the memory device Ns times to produce Ns respective readouts. The data page is stored in the target WL encoded using ECC 50. In the present example, the processor reads the target data page Ns=5 times. Depending on the data page type (the bit-significance value LSB, MSB or USB associated with the data page) the processor configures R/W module 36 to perform each read operation using one or more read thresholds. In this example, with reference to FIG. 2, in reading a LSB data page, the processor configures the R/W module to read the target page using pairs of read thresholds T1i and T5i, i=1 . . . 5, to produce respective readouts RD1 . . . RD5.

At a reference reading step 154, the processor reads the target page using read thresholds (e.g., one read threshold from each threshold-set) that are configured optimally, to produce a reference readout. For example, the processor configures the read thresholds in aiming to achieve minimum number of errors in the reference readout. In an embodiment, the read thresholds used for reading one of the readouts RD1 . . . RD5 of step 150, e.g., the centered readout RD3, were configured for minimum readout errors. In this case, RD3 serves as the reference readout, and the processor may skip step 154.

At a threshold-set separation step 158, the processor reads from the target WL one or more data pages having respective bit-significance values different from the bit-significance value of the target data page. For the reading operations of step 158, the processor configures the R/W module to use read thresholds that are typically optimal for these data pages. Alternatively, since these read thresholds are required for separating among the threshold-set, these read thresholds need not be optimal.

The processor uses the data pages read at step 158 for separating between memory cells in the target WL belonging to different respective threshold-sets. In an example embodiment, when the target data page is a LSB data page, the processor reads from the target WL the MSB and USB pages, for differentiating between the memory cells of the target WL that are read using read thresholds of threshold-sets RV1 and RV5, respectively.

In some embodiments, the processor does not separate between all the neighbor programming level. For example, the processor may classify the memory cells in the target WL to cell-groups so that at least one cell-group corresponds to two or more programming levels of the neighbor memory cells.

At a neighbor WL reading step 162 the processor reads LSB, MSB and USB data pages (in case of a TLC device) from a neighbor WL, e.g., adjacent to the target WL. Using the data pages read from the neighbor WL, the processor identifies the programming levels NLn, n=0 . . . Np-1 of the respective memory cells in the neighbor WL. The neighbor WL may be positioned below or above the target WL. At a cell classification step 166, the processor classifies the memory cells in the target WL into Np·NRv disjoint cell-groups, wherein each of the cell-groups in associated with a respective threshold-set and a respective neighbor programming level NLn, n=0 . . . Np-1.

At a LLR estimation step 170, the processor calculates LLR values for zones defined by the read thresholds of each threshold-set. The processor calculates for each zone a number Np of LLR values, corresponding to the neighbor programming levels NLn, n=0 . . . Np-1. The processor estimates the LLR values based on the reference readout, the Ns readouts and the classification into the cell-groups, as will be described in detail below.

At a LLR assignment step 174, the processor assigns the calculated LLR values to the target memory cells whose threshold voltages fall in each zone, based on the classification of the target memory cells into the cell-groups. At a decoding step 178, the processor recovers the target data page by applying to the assigned LLR values soft decoding for decoding the ECC that was used in encoding the target data page before programmed to the target WL. Following step 178 the method terminates.

Figure 5:
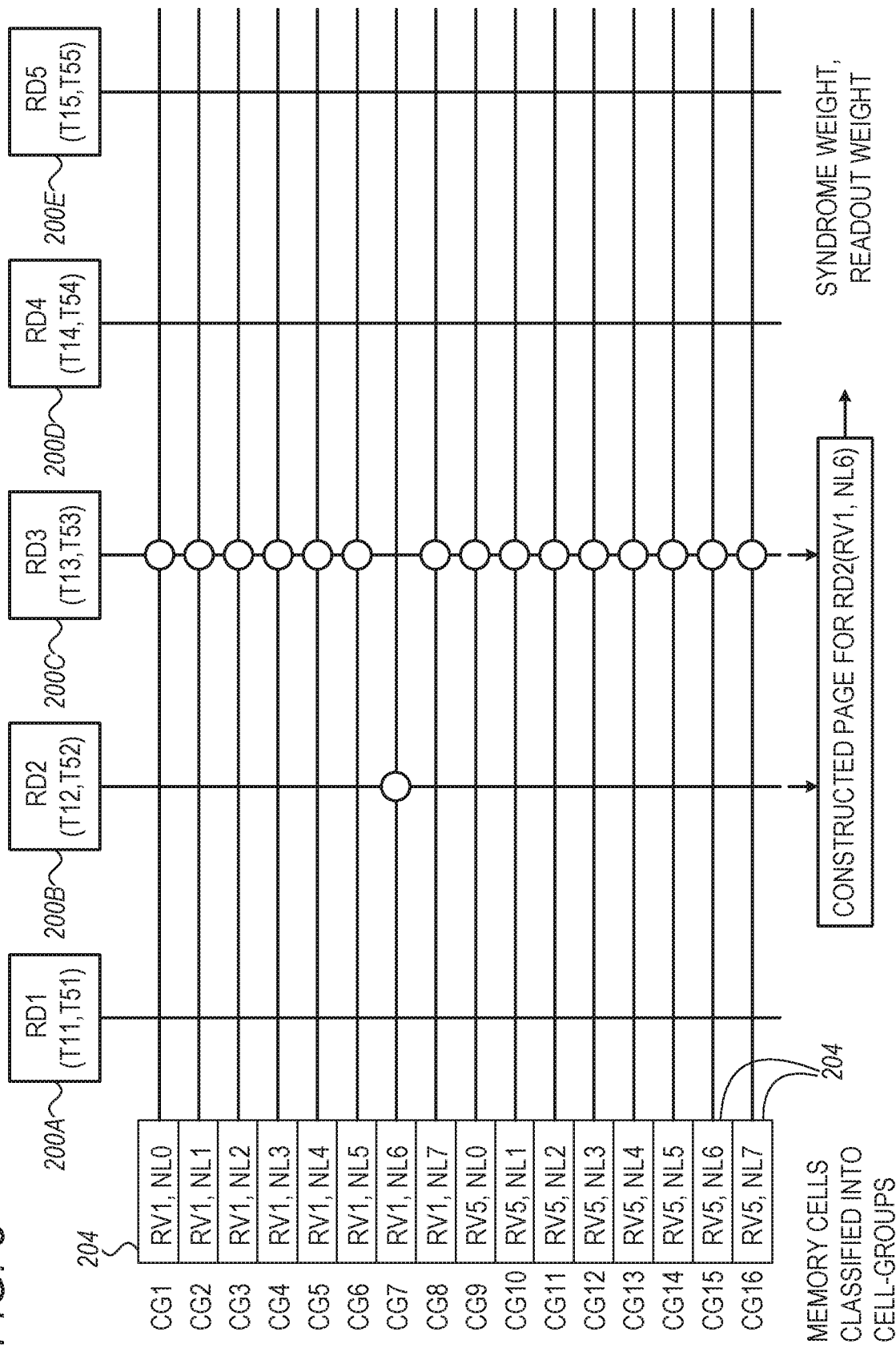
FIG. 5 is a diagram that schematically illustrates a method for generating a constructed page from multiple readouts of a target data page, to be used for syndrome weight and readout weight estimation, in accordance with an embodiment that is described herein.

Page Construction from Multiple Readouts for Syndrome Weight and Readout Weight Estimation FIG. 5 is a diagram that schematically illustrates a method for generating a constructed page from multiple readouts of a target data page, to be used for syndrome weight and readout weight estimation, in accordance with an embodiment that is described herein. As will be described in detail below, the processor uses the estimated syndrome weight and readout weight values for calculating LLR values.

In the example of FIG. 5, the processor reads a LSB data page from a group of memory cells of a target WL of a TLC device. As noted above, e.g., with reference to FIG. 3, the processor reads the target data page Ns times (in this example Ns=5), using pairs (T1i, T5i) of read thresholds, i=1 . . . Ns. The resulting readouts 200A . . . 200E are denoted RD1 . . . RD5. In some embodiments, processor 48 classifies the memory cells of the target WL into disjoint cell-groups 204. The memory cells in each cell-group are read using read thresholds selected from a given threshold-set and have neighbor memory cells programmed to a given programming level.

In the present example, the number of threshold-sets is NRv=2, wherein a threshold-set is identified by the relevant optimal RV read threshold. The number of programming levels is Np=8 and the programming levels of the neighbor memory cells are denoted NL0 . . . NL7. The total number of cell-groups is given by Np·NRv=16, and the cell-groups are denoted CG1 . . . CG16. In the present example, each cell-group is characterized by a threshold-set RV1 or RV5 and a neighbor programming level NLn. For example, the seventh cell-group is denoted CG7(RV1, NL6).

As will be described below, the processor estimates for each zone a number Np of LLR values corresponding to the Np programming levels of the neighbor memory cells. To this end, the processor calculates for each readout and for each cell-group Syndrome Weight (SW) and a Readout Weight (RW) values, from which the LLR values are derived. Given a data page of encoded data, the syndrome weight comprises the number of equations of the underlying ECC that are unsatisfied for the data page. The readout weight of a data page comprises the number of '1' bits in the data page.

In some embodiments, the processor generates a constructed page for a given readout and a given cell-group and calculates the syndrome weight and the readout values from the constructed page. The processor generates the constructed page by combining bits of a readout corresponding to memory cells that were classified into the given cell-group, and all other bits from the reference readout.

In FIG. 5, the grid of horizontal lines and vertical lines comprises a framework for combining bits for generating the constructed page. Each horizontal line corresponds to a respective cell-group, and each vertical line corresponds to a respective readout. A circle on a grid junction indicates the bits taken from the relevant readout that were read from the memory cells of the relevant cell-group. In the present example, RD3 is assumed to be the reference readout, so that the read thresholds T13 and T15 are configured optimally of minimum readout errors.

Consider generating a constructed page for RD2 and cell-group CG7(RV1, NL6). As shown in FIG. 5, the processor generates a constructed page by combining bits of RD2 corresponding to the memory cells of CG7, and all other bits from the reference readout RD3 corresponding to cell-groups CG1 . . . CG6 and CG8 . . . CG16.

In some embodiments, the bits of the reference readout are taken from RD3 and/or other readouts among RD1, RD4 and RD5. In general, the reference readout comprises bits from some readout and cell-group if this reduces the number of errors in the reference readout.

In some embodiments, the processor determines a readout weight value for a given cell-group CGi i=1 . . . 16, by counting the number of bits having a binary value '1' in the constructed page. In other embodiments, the processor counts the number of '1' bits only among bits in the constructed page that are related to the memory cells classified into the given cell-group CGi. In such embodiments, all other bits in the constructed page may be ignored or zeroed for calculating the readout weight value.

In some embodiments, for the purpose of syndrome weight calculation, the processor does not generate a syndrome weight from a fully constructed page as described above. Instead, the processor calculates multiple partial syndromes and applies bitwise XOR to the partial syndromes for calculating the full valid syndrome. For each readout RD1 . . . RD5, the processor calculates Np·NRv partial syndromes, wherein each partial syndrome is based on the bits read from the memory cells that were classified in accordance with the relevant cell-group and zeroing the other bits. The processor calculates the syndrome weight from the valid syndrome that was calculated from the partial syndromes.

Calculating LLR Values Depending on
Programming Levels of Neighbor Memory Cells

Figure 6:
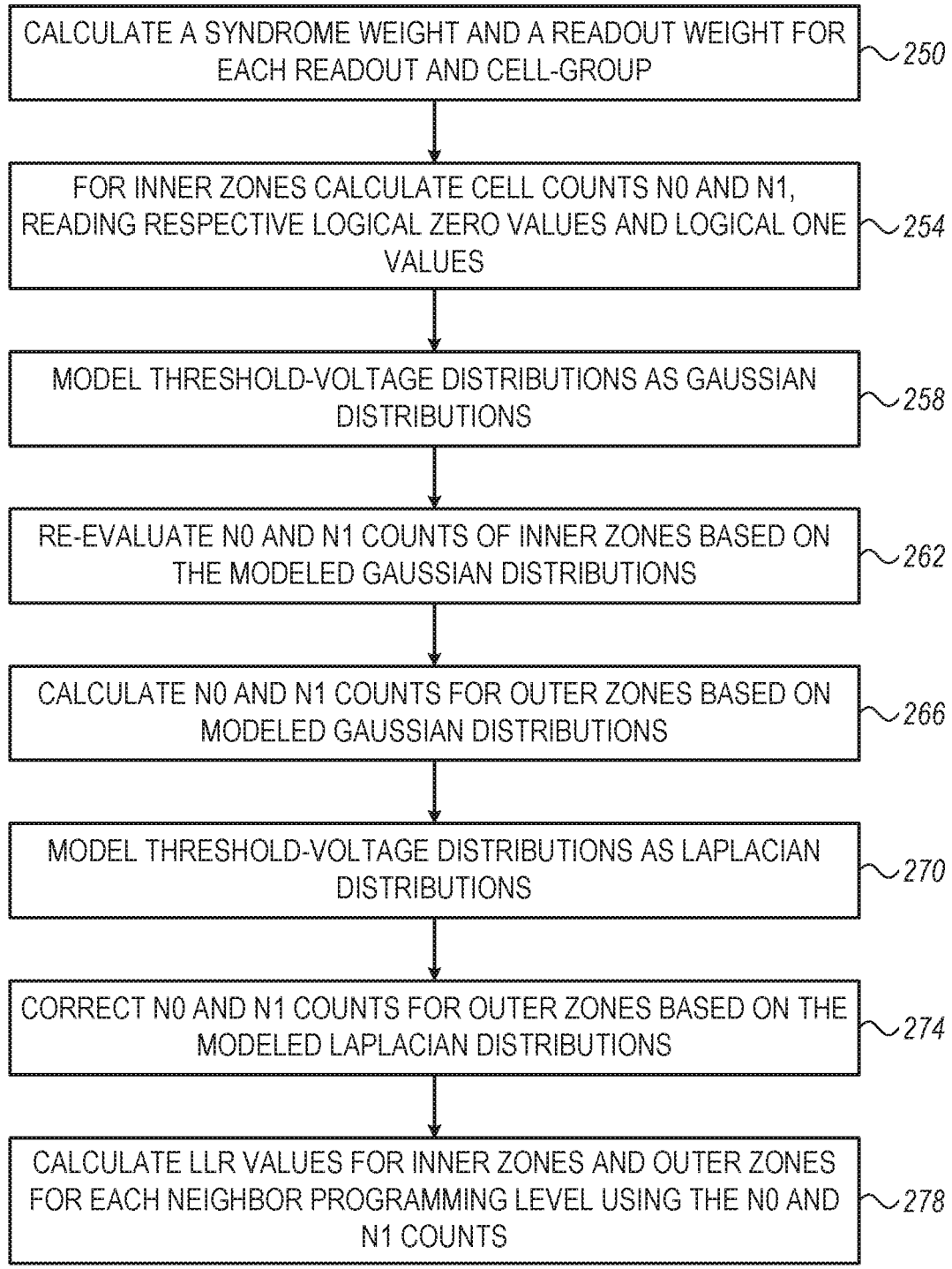
FIG. 6 is a flow chart that schematically illustrates a method for calculating LLR values, in accordance with an embodiment that is described herein.

FIG. 6 is a flow chart that schematically illustrates a method for calculating LLR values, in accordance with an embodiment that is described herein.

The method will be described as executed by processor 48.

The method begins with processor 48 calculating Syndrome Weight (SW) and Readout Weight (RW) values, at a weight calculation step 250. For each readout, the processor calculates a SW value and a RW value per each cell-group, based on a constructed page as described above.

Table 2 below depicts the RW and SW values that the processor calculates for each readout RD1 . . . RD5 and for each cell-group CG1 . . . CG16, wherein each of cell-groups CG1 . . . CG8 is associated with threshold-set RV1, and each of cell-groups CG9 . . . CG16 is associated with threshold-set RV5. In the table RW(i,j) and SW(i,j) denote the readout weight and the syndrome weight values for the group CGi, i=1 . . . 16 and the readout RDj, j=1 . . . 5.

TABLE 2

Readout Weight (RW) End Syndrome Weight (SW)
values for all readouts and cell-groups

|  | RD1 | RD2 | . . . | RD5 |
|---|---|---|---|---|
| CG1 (RV1, NL0) | RW (1, 1) | RW (1, 2) | . . . | RW (1, 5) |
|  | SW (1, 1) | SW (1, 2) |  | SW (1, 5) |
| CG2 (RV1, NL1) | RW (2, 1) | RW (2, 2) | . . . | RW (2, 5) |
|  | SW (2, 1) | SW (2, 2) |  | SW (2, 5) |
| . . . |  |  | . . . |  |
| CG8 (RV1, NL7) | RW (8, 1) | RW (8, 2) | . . . | RW (8, 5) |
|  | SW (8, 1) | SW (8, 2) |  | SW (8, 5) |
| CG9 (RV5, NL0) | RW (9, 1) | RW (9, 2) | . . . | RW (9, 5) |
|  | SW (9, 1) | SW (9, 2) |  | SW (9, 5) |
| . . . |  |  | . . . |  |
| CG16 (RV5, NL7) | RW (16, 1) | RW (12, 2) | . . . | RW (12, 5) |
|  | SW (16, 1) | SW (12, 2) |  | SW (12, 5) |

The processor uses the syndrome weight and readout weight values of Table 2 for estimating certain cell counts in zones of the threshold voltage axis as described herein. Each zone is defined by a single read threshold or by two read thresholds. A zone that is defined by both a left read threshold and a right read threshold is referred to herein as an "inner zone." A zone defined by a single read threshold or by one or more page-separators is referred to herein as an "outer zone." For example, in FIG. 2, zones Z2 . . . Z5 and Z8 . . . Z11 are inner zones, whereas zones Z1, Z6, Z7 and Z12 are outer zones.

At a cell counting step 254, the processor estimates a zero-count value denoted 'N0' and a one-count value denoted 'N1' for the inner zones. Consider an inner zone defined by left and right read thresholds denoted 'TL' and 'TR', respectively. Let RD_L and RD_R denote the readouts corresponding to the read thresholds TL and TR, respectively.

The following parameters are defined (e.g., for each cell-group):

TABLE 3

Parameters for estimating zone counts

| Parameter | |
|---|---|
| RW_L | Readout weight for RD_L |
| RW_R | Readout weight for RD_R |
| SW_L | Syndrome weight for RD_L |
| SW_R | Syndrome weight for RD_R |
| N0 | Number of memory cells reading '0' in the zone |
| N1 | Number of memory cells reading '1' in the zone |

Note that the parameters in Table 3 are assumed to be defined for each cell-group CGi of Table 2 above. For example, for zone Z2 the readouts RD_L=RD1 and RD_R=RD2 are read using read thresholds T11 and T12, respectively. For cell-group CG1 of Table 2, the readout weights and syndrome weights are given by RW_L=RW(1, 1), SW_L=SW(1,1), RW_R=RW(1,2) and SW_R=SW(1,2).

To estimate N0 and N1, the processor separately estimates a sum NS=N0+N1 and a difference ND=N1−N0. The processor calculates the sum NS as a function of the readout weights RW_L and RW_R as given by:

$$NS = N0 + N1 = RW\_R - RW\_L \quad \text{Equation 1:}$$

The processor calculates the difference ND using the syndrome weight values SW_R and SW_L as described herein. In general, the syndrome weight value is correlated to the number of errors in the readout or constructed page from which the syndrome weight was calculated. An expression known as the Gallager's equation, relates between the error probability ε and the probability ρ that one equation of the ECC is unsatisfied, is given by:

$$\rho = \frac{1 - (1 - 2\varepsilon)^d}{2} \quad \text{Equation 2}$$

In Equation 2, d denotes the check-node degree of the ECC code. The check-node degree is the number of bits participating in each of the parity check equations of the ECC. Assuming the ECC code word has N bits, the number of errors Ne is approximated by the expression Ne=ε·N. Further assuming that the ECC comprises M check equations, the number of unsatisfied check equations or syndrome weight 'SW' is approximated by the expression SW=ρ·M. The number of errors Ne is related to the syndrome weight SW by an inverse Gallager's equation:

$$Ne = \frac{N}{2}\left[1 - \left(1 - \frac{2 \cdot SW}{M}\right)^{1/d}\right] \triangleq f(SW) \quad \text{Equation 3}$$

By applying the function ƒ(SW) of Equation 3 to the syndrome weights SW_L and SW_R, the processor calculates the difference ND as:

$$ND = N0 - N1 = f(SW\_R) - f(SW\_L) \quad \text{Equation 4:}$$

Using Equations 2 and 4, the processor calculates the separate values of N0 and N1 as:

$$N0 = \frac{NS + ND}{2} \quad \text{Equation 5}$$

-continued $$N1 = \frac{NS - ND}{2}$$

The estimated values of N1 and N0 may undesirably get negative values. To resolve such cases, the processor limits N0 and N1 of Equation 5 to non-negative values, as given by:

IF $N0<0$, set $N0=0$ and set $N1=NS$

IF $N1<0$, set $N1=0$ and set $N0=NS$   Equation 6:

The processor repeats the calculation of N0 and N1 as described above for all inner zones of a threshold-set and for all cell-groups CGi, i=1 ... Np–NRv. In some embodiments, the processor calculates LLR values using the N0 and N1 values, given by:

$$LLR = \log\left(\frac{N0}{N1}\right)$$   Equation 7

The LLR values calculated based on the cell counts N0 and N1 values estimated as described above, may be insufficiently accurate for high performance soft decoding.

In some embodiments, at a Gaussian modeling step 258, the processor models threshold voltage distributions corresponding to the threshold-sets as Gaussian distributions, which the processor then uses for updating the initial N0 and N1 counts, estimated e.g., using Equations 1 and 4-6 above, thus achieving much more accurate estimations for the LLR values.

Next, step 258 is described in detail. As described above, the processor calculated N0 and N1 counts for the inner zones of the given threshold-set for each cell-group and inner zone. Table 3 below depicts the zero-counts N0(CGi, Zk) and one-counts N1(CGi,Zk) assigned to the inner zones in the cell-groups indexed CGi, i=1 ... 16. The zones are indexed Zk, k=1 ... 6 for CG1 ... CG8 and k=7 ... 12 for CG9 ... 16.

TABLE 3

Zero-counts N0 and one-counts N1 assigned to respective cell-groups and inner zones

| zones | Z1 | Z2 | ... | Z5 | Z6 |
|---|---|---|---|---|---|
| CG1 (RV1, NL0) | NA | N0 (1, 2)<br>N1 (1, 2) | ... | N0 (1, 5)<br>N1 (1, 5) | NA |
| ... | ... | ... | ... | ... | ... |
| CG8 (RV1, NL7) | NA | N0 (8, 2)<br>N1 (8, 2) | ... | N0 (8,5)<br>N1 (8,5) | NA |

| zones | Z7 | Z8 | ... | Z11 | Z12 |
|---|---|---|---|---|---|
| CG9 (RV5, NL0) | NA | N0 (9, 2)<br>N1 (9, 2) | ... | N0 (9, 11)<br>N1 (9, 11) | NA |
| ... | ... | ... | ... | ... | ... |
| CG16 (RV5, NL7) | NA | N0 (16, 2)<br>N1 (16, 2) | ... | N0 (16, 11)<br>N1 (16, 11) | NA |

In Table 3, the outer zones Z1, Z6, Z7 and Z12 are ignored.

In some embodiments, the processor estimates two Gaussian models for each cell-group. Specifically, the processor estimates Gaussian models for the threshold voltage distributions centered to the right and to the left of the RV of the relevant threshold-set using the respective N0 and N1 counts over the relevant inner zones. Note that each Gaussian model is associated with a respective neighbor programming levels of NL0 ... NL7, as specified in the respective cell-group.

Let Nz denote the number of zones per each threshold-set. In the present example Nz=6. The Nz zones in each threshold-set comprise a number L=Nz–2 of inner zones and two outer zones. For example, in Table 3 the number of inner zones is L=6–2=4.

Let $ZI\_1$ ... $ZI\_L$ denote the L inner zones and let the vector $[C_1 ... C_L]$ denote a vector of the N0 counts or N1 counts assigned to a selected cell-group across the inner zones. In the present example, for the cell-group CG1(RV1, NL0) of Table 3, the vector $[C_1 ... C_4]$ is given by [N0(1,2) ... N0(1,5)] or [N1(1,2) ... N1(1,5)]. Note that the vector $[C_1 ... C_L]$ depends on the associated neighbor programming level NL0 ... NL7, and on a selection between using N0 or N1 counts.

The description below refers mainly to processing that the processor applies to zones Z1 ... Z6 associated with threshold-set RV1. The processor applies similar processing to zones Z7-Z12 defined by the read thresholds of RV5.

Each inner zone $ZI\_k$ (k=1 ... L) defines a respective voltage range of the threshold voltages axis, denoted $[v_k^{low}, v_k^{high}]$. The threshold voltages at the edges of an inner zone are defined by the read thresholds that the processor sets for reading the target page. In the present example, the zones are defined sequentially without gaps, and therefore the expression $v_k^{high}=v_{k+1}^{low}$ for k=1 ... L–1 holds.

Consider a Gaussian model specified by mean and variance parameters denoted $\mu$ and $\sigma^2$, respectively. The number Nc of memory cells of the target WL whose threshold voltages fall within a voltage range $[v^{low}, v^{high}]$ is given by:

$$Nc = \frac{Nv}{\sqrt{2\pi\sigma^2}} \int_{v^{low}}^{v^{high}} e^{-\frac{(v-\mu)^2}{2\sigma^2}} dv =$$

$$Nv\left[Q\left(\frac{v^{low}-\mu}{\sigma}\right) - Q\left(\frac{v^{high}-\mu}{\sigma}\right)\right]$$   Equation 8

In Equation 8, Nv denotes the number of memory cells per each Gaussian distribution. In Equation 3, the function Q(•) denotes the Q-function of the standard normal distribution.

In some embodiments, for estimating a Gaussian model that best fits the vector $[C_1 ... C_L]$ containing a number L of N0 (or N1) counts over the inner zones, the processor uses a suitable cost function and searches for the parameters $[\mu, \sigma^2]$ that together minimize this cost function. In an example embodiment, the processor uses a Means Square Error (MSE) type of a cost function given by:

$$C_{MSE}(\mu, \sigma^2) = \sum_{k=1}^{L} \left(C_k - Nv\left[Q\left(\frac{v_k^{low}-\mu}{\sigma}\right) - Q\left(\frac{v_k^{high}-\mu}{\sigma}\right)\right]\right)^2$$   Equation 9

The processor may minimize the used cost function in various ways. In some embodiments, the processor evaluates the underlying cost function, e.g., $C_{MSE}(\varphi, \sigma^2)$, over a predefined grid of multiple $\mu$ and $\sigma^2$ values, and selects the mean $\mu_{opt}$ and variance $\sigma_{opt}^2$ values for which the cost function gets is minimized over the multiple $\mu$ and $\sigma^2$ values. In an embodiment, the processor performs a hierarchical search, e.g., first minimizing the cost function over a coarse grid of the μ and σ² parameters, and then searching over a fine grid of the μ and σ² parameters that is located about the optimal mean and variance value found using the coarse grid. In some embodiments, the processor is aware of whether the mean of the Gaussian is higher or lower than the optimal read threshold, in which case the grid of parameters may be reduced in the range of the μ parameter, accordingly.

In some embodiments, the processor applies post processing to the mean and variance parameters of multiple modeled Gaussian distributions. For example, in some embodiments, the multiple Gaussian distributions are expected to share a common variance parameter. In this case the processor may calculate an average variance value to be used for each of the multiple Gaussian distributions. As another example, in an embodiment, the mean parameters are expected to have shift values that depends on the neighbor programming levels. In this embodiment, the processor may fit a linear function to multiple mean parameters and adjust the mean values of the Gaussian distributions to respective outcomes of the linear function.

At a cell count updating step 262 the processor re-evaluates the N0 and N1 counts of the inner zones (e.g., in Table 3) based on the modeled gaussian distributions as described herein. Assuming a best-fitted Gaussian model having parameters [$\mu_{opt}, \sigma_{opt}^2$], the processor re-evaluates the N0 counts and N1 counts for each cell-group, by calculating updated counts $C'_k$ (of the vector [$C_1 \ldots C_L$]) based on the best-fitted Gaussian model given as:

$$C'_k = Nv\left[Q\left(\frac{v_k^{low} - \mu_{opt}}{\sigma_{opt}}\right) - Q\left(\frac{v_k^{high} - \mu_{opt}}{\sigma_{opt}}\right)\right], \quad \text{Equation 10}$$
$$k = 1 \ldots L$$

The processor replaces the N0 and N1 for the inner zones in Table 3 with the relevant $C'_k$ values calculated using Equation 10. Alternatively, the processor averages, for each k, between the $C_k$ values and respective $C'_k$ values.

At an outer zone cell counting step 266, the processor calculates N0 and N1 counts for the outer zones. In some embodiments, the calculation of N0 and N1 for the outer zones may be based on the modeled Gaussian distributions of step 258 or on Laplacian models as will be described below. In some embodiments, based on the Gaussian models, the processor calculates for the outer left zone (e.g., Z1) an expression similar to Equation 10 in which $Q(v_k^{low})$ is replaced with the number 1.0, and sets $v_k^{high}$ to a threshold voltage value corresponding to the left side read threshold (T11) of zone Z2. Similarly, for the outer right zone (e.g., Z6) the processor calculates an expression similar to Equation 10 in which $Q(v_k^{high})$ is replaced with a number 0.0, and sets $v_k^{low}$ to a threshold voltage value corresponding to the right side read threshold (T15) of zone Z5.

In some embodiments, the tails of the threshold voltage distributions may be modeled more accurately using a Laplacian distribution rather than using a Gaussian distribution. In such embodiments, the N0 and N1 counts that were estimated for the outer zones based on the Gaussian distribution models alone, may be biased toward lower values than the actual counts. This in turn may result in inaccurate estimations of LLR values, which are derived from these biased counts, e.g., using the calculation of Equation 7.

In some embodiments, at a Laplacian modeling step 270, the processor estimates a model of a Laplacian distribution for correcting the N0 and N1 counts that were calculated for the outer zones based on the Gaussian models, as described above.

In the description below, the mean value of the threshold voltage distribution is assumed to lie above (to the right of) the optimal read threshold and therefore the cell counts N0 and N1 increase with the zone index. Alternatively, the mean value lies below the optimal read threshold in which case the cell counts N0 and N1 decrease with the zone index.

Let F(x) denote a Laplacian distribution given by, $$F(x) = \frac{1}{2b}\exp\left(-\frac{x-\mu}{b}\right), x \geq \mu \quad \text{Equation 11}$$

In the description that follows the variable R is given by β=exp(1/b) and γ=exp(−μ/b)/2.

The processor first searches for a solution to the equation g(β)=0 over an exponential parameter β, wherein the function g(β) is given by:

$$g(\beta) = A(\beta) - B(\beta) \quad \text{Equation 12:}$$

wherein A(β) is given by:

$$A(\beta) = \frac{C_k \sum_{k=1}^{L}\left(\beta^{v_k^{high}} - \beta^{v_k^{low}}\right)}{\sum_{k=1}^{L}\left(\beta^{v_k^{high}} - \beta^{v_k^{low}}\right)^2} \quad \text{Equation 12a}$$

and B(β) is given by:

$$B(\beta) = \frac{1}{Nv} \cdot \frac{C_k \sum_{k=1}^{L}\left(v_k^{high}\cdot\beta^{v_k^{high}} - v_k^{low}\cdot\beta^{v_k^{low}}\right)}{\sum_{k=1}^{L}\left(\beta^{v_k^{high}} - \beta^{v_k^{low}}\right)\cdot\left(v_k^{high}\cdot\beta^{v_k^{high}} - v_k^{low}\cdot\beta^{v_k^{low}}\right)} \quad \text{Equation 12b}$$

In Equations 12, 12a and 12b, [$C_1 \ldots C_L$] is the same vector of N0 or N1 counts in Table 3 before updated based on the Gaussian model, and $v_k^{low}$ and $v_k^{high}$ are the threshold voltages at the edges of the inner zones as described above.

In some embodiments, the processor searches for an optimal parameter $\beta_{opt}$ for which $g(\beta_{opt})$ is zeroed (or approximately zeroed) by evaluating the expressions in Equations 12, 12a and 12b over a one dimensional grid of β values in the range 1≤β.

Using the optimal parameter $\beta_{opt}$, the processor calculates another parameter given by, $$\gamma = \frac{1}{Nv} \cdot \frac{C_k \sum_{k=1}^{L}\left(\beta_{opt}^{v_k^{high}} - \beta_{opt}^{v_k^{low}}\right)}{\sum_{k=1}^{L}\left(\beta_{opt}^{v_k^{high}} - \beta_{opt}^{v_k^{low}}\right)^2} \quad \text{Equation 13}$$

In an embodiment, using γ, the processor may estimate the N0 and N1 counts in a threshold voltage range between $v^{low}$ and $v^{high}$ as given by:

$$CL = Nv \cdot \gamma \cdot (\beta^{v^{high}} - \beta^{v^{low}}) \quad \text{Equation 14:}$$

Note that in Equations 12-14, the parameters β, γ and CL correspond to a given neighbor programming level via the respective cell-groups. In some embodiments, the processor evaluates the expression in Equation 14 for each inner zone, by selecting the threshold voltage range accordingly. Moreover, the processor calculates eight CL values corresponding to the eight neighbor programming levels for one or more inner zones.

At an outer zone count correction step 274, the processor optionally corrects N0 and N1 counts for the outer zones based on the modeled Laplacian distributions. In some embodiments, the processor evaluates CL values based on the Laplacian model as described above, for a zone neighbor to an outer zone. The CL of the neighbor zone may be used for correcting the counts calculated for that outer zone using the Gaussian models. For example, for correcting N0 and N1 of zone Z1, the processor uses N0 and N1 counts calculated for zone Z2 as follows:

$$C_1^{GL} = C_1^G \cdot \frac{C_2^L}{C_2^G} \quad \text{Equation 15}$$

In Equation 15, $C_1^G$ and $C_2^G$ are the cell counts calculated based on the Gaussian model for the respective zones Z1 and Z2, $C_2^L$ is the cell count calculated based on the Laplacian model for zone Z2, and $C_1^{GL}$ is the corrected cell count based on the Laplacian model. In some embodiments, the processor performs the correction at step 274 conditionally. For example, the processor accepts a corrected cell count that satisfies $C_1^{GL} > C_1^G$ so that the correction operation increases the cell count in the outer zone relative to using the Gaussian model alone. The processor applies similar Laplacian modeling and cell count corrections in other outer zones such as Z6, Z7 and Z12.

At a LLR calculation step 278, the processor calculates LLR values for the inner zones and for the outer zones, for the eight neighbor programming levels, using the relevant N0 and N1 counts that were calculated based on the Gaussian models, Laplacian models or both. In an embodiment, for given N0 and N1 counts, the processor calculates a respective LLR value using Equation 7 above.

Following step 278 the LLR values for all zones and neighbor programming levels are available for soft decoding, and the method terminates.

Next is described an alternative method to the method described at step 258 above, for estimating Gaussian models for the threshold voltage distributions. In this alternative method, processor 48 estimates unsplit N0 and N1 counts for the inner zones. The unsplit N0 and N1 counts are independent of the classification of the memory cells of the target WL into the Np neighbor programming levels. For calculating the unsplit N0 and N1 counts, the processor calculates syndrome weights and readout weights for the inner zones as described above, but without using the cell classification into the Np neighbor programming levels. Moreover, in calculating N0 and N1 based on the syndrome weights and the readout weights, Table 3 may be organized such that the cell-groups CG1(RV1,NL0) . . . CG8(RV1,NL7) are considered as a unified cell-group denoted CG(RV1) and the cell-groups CG9(RV5,NL0) . . . CG16(RV5,NL7) are considered as another unified cell-group denoted CG(RV5).

The processor estimates, using the unsplit N0 and N1 counts of the inner zones, two unsplit Gaussian distributions for each threshold-set, in a similar manner to the embodiments described above.

Let $\mu_T$ and $\sigma_T^2$ denote the mean and variance of an unsplit Gaussian distribution. In some embodiments, the processor models an unsplit Gaussian distribution approximately as a mixture distribution comprising Np split Gaussian distributions, each of which corresponds to a respective neighbor programming level NLn. In the present model, the $n^{th}$ split Gaussian distribution has a mean parameter denoted $\mu_n$, and all the Np split Gaussian distributions have a common variance parameter denoted $\sigma_s^2$. Let $d_n$ denote a shift in mean values defined as the difference $d_n = \mu_T - \mu_n$. The value of $d_n$ is indicative of the amount of affect that the neighbor memory cells programmed to the $n^{th}$ programming level have on the target memory cells.

It can be shown that the variance $\sigma_T^2$ of the unsplit Gaussian distribution is related to the common variance of $\sigma_s^2$ of the split Gaussian distributions as given by:

$$\sigma_T^2 = \sigma_s^2 + \frac{1}{Np} \sum_{n=0}^{Np-1} d_n^2 \quad \text{Equation 17}$$

The mean and variance parameters $\mu_n$ and $\sigma_s^2$ of $n^{th}$ split Gaussian distribution depend on $d_n$. A method for estimating the shift in mean values $d_n$ is described below. In some embodiments, the processor estimates the mean parameter of the $n^{th}$ split Gaussian by calculating:

$$\mu_n = \mu_T - d_n \quad \text{Equation 18:}$$

The processor further estimates the common variance parameter based on Equation 17, by calculating:

$$\sigma_s^2 = \sigma_T^2 - \frac{1}{Np} \sum_{n=0}^{Np-1} d_n^2 \quad \text{Equation 19}$$

A method for estimating $d_n$ is now descried. The method performed by the processor comprises the steps: (i) estimating an optimal read threshold Topt for the unsplit Gaussian distribution, (ii) estimating an optimal read threshold Tn_opt for each of the split Gaussian distributions and (iii) calculating $d_n$ = Topt − Tn_opt.

In some embodiments, the processor estimates optimal read threshold based on syndrome weights calculated for the Ns readouts. The processor calculates the syndrome weights for the readouts using constructed pages as described above. In an example embodiment, the processor fits a suitable scalar function to three or more syndrome weight values corresponding to one or more read thresholds used for producing the Ns readouts, and estimates the optimal read threshold for which that scalar function in minimized. In an example embodiment, the processor fits a parabolic function to three syndrome weight values corresponding, for example to T11, T13 and T15, and estimates the optimal read threshold that minimizes the parabolic function. For estimating Tn_opt, the processor estimates separate split syndrome weight values for cell-groups having different respective neighbor programming levels.

In some embodiments, the processor estimates respective shift values between the unsplit Gaussian distribution and each of split threshold voltage distributions. The processor then calculates the LLR values for each zone and neighbor programming level based on the estimated shift values.

Improving Readout Performance by Calculating Optimal Read Thresholds Depending on Neighbor Programming Levels In the embodiments described above, the readout performance was improved by calculating LLR values in each zone over multiple cell-groups for which the neighbor memory cells have different programming levels. In alternative embodiments, the processor estimates optimal read thresholds for each of the cell-groups that were classified based on the Np neighbor programming levels. The processor then reads the target memory cells using the optimal read thresholds and combines the bits read from the memory cells in the respective cell-groups to a combined readout. For soft decoding, the processor may assign to the bits of the combined readout predefined LLR values that were stored in LLR tables, or LLR values that are calculated dynamically, e.g., using the methods described above.

The method may be implemented by processor 48 using the following steps:
1. Read a neighbor page from a neighbor WL of a target WL that stores a target page encoded using ECC to be read, and classify the memory cells in the target WL into multiple cell-groups based on the Np neighbor programming levels to which the memory cells in the neighbor WL are programmed. Each of the cell-groups is associated with a respective programming level.
2. Calculate multiple respective sets of optimal read thresholds for each of the multiple cell-groups;
3. Read the target WL using each of the multiple sets of the optimal read thresholds, and combine bits read from the memory cells of the respective cell-groups to produce a combined page.
4. Assign LLR values to the bits of the combined page per zone and neighbor programming level.
5. Recover the target page by applying to the bits of the combined page, with the assigned LLR values, soft decoding for decoding the ECC.

In some embodiments, the processor holds average LLR values per zone and neighbor programming level in a table. The processor assigns the LLR values to the bits of the combined page by retrieving LLR values from the table. In other embodiments, the processor calculates the LLR values for bits read from the memory cells in the cell-groups.

In some embodiments, the processor estimates the optimal read thresholds for the different respective cell-groups (or neighbor programming levels), by calculating multiple syndrome weights, as described above. The processor thus fits a suitable function (e.g., a parabolic function) to the syndrome weights, and finds an optimal read threshold that minimizes the function.

The embodiments described above are given by way of example, and other suitable embodiments can also be used. For example, although in the embodiments above the neighbor memory cells belong to a single neighbor WL, this is not mandatory. In alternative embodiments, neighbor memory cells belonging to two or more neighbor WLs may be considered. For example, instead of classifying the target memory cells into Np neighbor programming levels, $Np^2$ neighbor programming levels corresponding to neighbor memory cells in two adjacent WLs may be used.

In some of the embodiments above, LLR values are calculated dynamically for a group of target memory cells, per each zone and neighbor programming level. In alternative embodiments, LLR values are calculated dynamically, only per zone, without taking into consideration the programming levels of neighbor memory cells. This may improve readout performance, for example, when the device suffers from impairments that are not directly related to the programming levels of neighbor cells.

Although some of the embodiments that were described above refer to retention drift that depends on the neighbor programming level, the disclosed embodiments are applicable to any other impairments in which memory cells are affected by neighboring memory cells, e.g., a crosstalk impairment.

Although the embodiments described above refer mainly to LLR metrics, in alternative embodiments other types of soft metrics can also be used.

The embodiments described above may be applied, for example, when reading and decoding a data page using methods that do not take into consideration neighbor memory cells fails.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. A storage device, comprising:
multiple memory cells arranged in multiple Word Lines (WLs), configured to store data in Np programming levels of threshold voltage values; and
circuitry configured to:
  define NRv threshold-sets, wherein each of the threshold-sets comprises Ns read thresholds that define Ns+1 zones of threshold voltage values for each respective threshold-set;
  read a data page Ns times, from a target WL comprising multiple target memory cells for producing respective Ns readouts, wherein each of the Ns readouts is read using one or more read thresholds respectively selected from the NRv threshold-sets, and wherein the target page was encoded for storage using an Error Correction Code (ECC);
  identify Np neighbor programming levels to which the memory cells in one or more neighbor WLs to the target WL, are programmed, and make a classification of the target memory cells in the target WL into a plurality of cell-groups, wherein each of the cell-groups is associated with (i) a respective threshold-set and (ii) a respective neighbor programming level;
  for each zone calculate Np Log likelihood Ratio (LLR) values for the respective Np neighbor programming levels;
  assign the calculated LLR values to the target memory cells whose threshold voltages fall in that zone; and
  recover the target page by applying to the assigned LLR values soft decoding for decoding the ECC.

2. The storage device according to claim 1, wherein the circuitry is configured to produce a reference readout by reading the target page from the target WL using one or more read thresholds configured for minimum readout errors, and to calculate the Np LLR values based on the reference readout, on the Ns readouts, and on the classification into the cell-groups.

3. The storage device according to claim 1, wherein the circuitry is configured to estimate for each cell-group and zone (i) a N0 count that evaluates a number of the target memory cells in the cell-group and zone that read a logical '0' value, and (ii) a N1 count that evaluates a number of the target memory cells in the cell-group and zone that read a logical '1' value, and calculate a LLR value for each zone and neighbor programming level as log(N0/N1).

4. The storage device according to claim 3, wherein for inner zones of a given threshold-set, each inner zone is defined by both an upper read threshold and a lower read threshold, the circuitry is configured to estimate initial N0 counts and initial N1 counts for each of the cell-groups, to model first and second Gaussian distributions for the threshold voltage distributions of the target memory cells corresponding to the given threshold-set and cell-group, based respectively on the estimated initial N0 counts and the initial N1 counts of the cell-group over the inner zones, and to evaluate N0 counts and N1 counts using the respective first and second Gaussian distributions.

5. The storage device according to claim 4, wherein the circuitry is configured to model at least tails of the threshold voltage distributions of the target memory cells corresponding to the given threshold-set and cell-group, by estimating first and second Laplacian distributions, based respectively on the initial N0 counts and the initial N1 counts over the inner zones, and to update the N0 counts and the N1 counts corresponding to outer zones of the given threshold-set, each outer zone is defined by a single read threshold, based on the respective first and second Laplacian distributions.

6. The storage device according to claim 4, wherein the circuitry is configured to estimate the initial N0 counts and the initial N1 counts by calculating syndrome weight values and readout weight values for each cell-group based on the respective readouts, calculating count differences (N1−N0) and count sums (N1+N0) using the syndrome weights and the readout weights, respectively, and calculating the initial N0 and N1 counts based on the count differences and on the count sums.

7. The storage device according to claim 4, wherein the circuitry is configured to estimate the first Gaussian distribution by defining a cost function of a mean parameter and of a variance parameter of a Gaussian distribution, the cost function depends on the initial N0 counts of a cell-group over the inner zones, and to select an optimal mean parameter and an optimal variance parameter that together minimize the cost function.

8. The storage device according to claim 3, wherein the circuitry is configured to estimate for each zone (i) an unsplit N0 count that evaluates a number of the target memory cells in the zone that read a logical '0' value, and (ii) an unsplit N1 count that evaluates a number of the target memory cells in the zone that read a logical '1' value, to model based on the unsplit N0 count and the unsplit N1 count respective first and second unsplit Gaussian threshold voltage distributions corresponding to the given threshold-set, to model first and second split Gaussian threshold voltage distributions corresponding to the given threshold-set and to the respective cell-groups, by evaluating shift values between a mean value of the unsplit Gaussian distribution and respective mean values of the split Gaussian distributions, and to estimate the N0 and N1 counts using the split Gaussian distributions.

9. The storage device according to claim 8, wherein the circuitry is configured to evaluate a given shift value in a given zone by (i) estimating an unsplit read threshold for reading the target memory cells corresponding to the zone with minimum readout errors, (ii) estimating a split read threshold for reading the target memory cells corresponding to the given zone and cell-group with minimum readout errors, and (iii) estimating the given shift value as a difference between the unsplit read threshold and the split read threshold.

10. The storage device according to claim 9, wherein the circuitry is configured to estimate one or more of the unsplit read threshold and the split read threshold, by calculating multiple syndrome weight values over multiple respective zones, fitting a predefined scalar function to the multiple syndrome weight values, and estimating a read threshold value for which the scalar function is minimized.

11. The storage device according to claim 1, wherein the memory cells experience retention loss at a rate that depends on the threshold voltage programmed to a neighbor memory cell.

12. The storage device according to claim 1, wherein the circuitry is configured to estimate respective shift values between a threshold voltage distribution of the target memory cells and each of threshold voltage distributions of part of the target memory cells belonging to each of the respective cell-groups, and to calculate the LLR values for each zone and neighbor programming level based on the estimated shift values.

13. A method for data storage, comprising:
in a storage device comprising multiple memory cells arranged in multiple Word Lines (WLs), the memory cells store data in Np programming levels of threshold voltage values, defining NRv threshold-sets, wherein each of the threshold-sets comprises Ns read thresholds that define Ns+1 zones of threshold voltage values for each respective threshold-set;
reading a data page Ns times, from a target WL comprising multiple target memory cells, to produce Ns respective readouts, wherein each of the Ns readouts is read using a set of NRv read thresholds each selected from the NRv threshold-sets, and wherein the target page was encoded for storage using an Error Correction Code (ECC);
identifying Np neighbor programming levels to which the memory cells in one or more neighbor WLs to the target WL, are programmed, and making a classification of the target memory cells in the target WL into a plurality of cell-groups, wherein each of the cell-groups is associated with (i) a respective threshold-set and (ii) a respective neighbor programming level;
for each zone calculating Np Log likelihood Ratio (LLR) values, for the respective Np neighbor programming levels;
assigning the calculated LLR values to the target memory cells whose threshold voltages fall in that zone; and
recovering the target page by applying to the assigned LLR values soft decoding for decoding the ECC.

14. The method according to claim 13, wherein calculating the Np LLR values comprises producing a reference readout by reading the target page from the target WL using one or more read thresholds configured for minimum readout errors, and calculating the Np LLR values based on the reference readout, on the Ns readouts, and on the classification into the cell-groups.

15. The method according to claim 13, wherein calculating the LLR values comprises estimating for each cell-group and zone (i) a N0 count that evaluates a number of the target memory cells in the cell-group and zone that read a logical '0' value, and (ii) a N1 count that evaluates a number of the target memory cells in the cell-group and zone that read a logical '1' value, and calculating a LLR value for each zone and neighbor programming level as log(N0/N1).

16. The method according to claim 13, wherein the memory cells experience retention loss at a rate that depends on the threshold voltage programmed to a neighbor memory cell.

17. The method according to claim 13, wherein estimating the LLR values comprises estimating respective shift values between a threshold voltage distribution of the target memory cells and each of threshold voltage distributions of part of the target memory cells belonging to each of the respective cell-groups, and calculating the LLR values for each zone and neighbor programming level based on the estimated shift values.

18. A storage device, comprising:
multiple memory cells arranged in multiple Word Lines (WLs), configured to store data in Np programming levels of threshold voltage values; and
circuitry configured to:
read a neighbor page from a neighbor WL of a target WL that stores a target page encoded using ECC to be read, and classify the memory cells in the target WL into multiple cell-groups based on the Np neighbor programming levels to which the memory cells in the neighbor WL are programmed;
calculate multiple respective sets of optimal read thresholds for each of the multiple cell-groups;
read the target WL using each of the multiple sets of the optimal read thresholds, and combine bits read from the memory cells of the respective cell-groups to produce a combined page;
assign LLR values to the bits of the combined page per zone and neighbor programming level; and
recover the target page by applying to the bits of the combined page, with the assigned LLR values, soft decoding for decoding the ECC.

19. The storage device according to claim 18, wherein the circuitry is configured to hold predefined LLR values per zone and neighbor programming level in a table, and to assign the LLR values by retrieving the predefined LLR values from the table.

20. The storage device according to claim 18, wherein the circuitry is configured to assign the LLR values, by calculating the LLR values for bits read from the memory cells in the cell-groups.

21. A method for data storage, comprising:
in a storage device comprising multiple memory cells arranged in multiple Word Lines (WLs), the memory cells store data in Np programming levels of threshold voltage values,
reading a neighbor page from a neighbor WL of a target WL that stores a target page encoded using ECC to be read, and classifying the memory cells in the target WL into multiple cell-groups based on the Np neighbor programming levels to which the memory cells in the neighbor WL are programmed;
calculating multiple respective sets of optimal read thresholds for each of the multiple cell-groups;
reading the target WL using each of the multiple sets of the optimal read thresholds, and combining bits read from the memory cells of the respective cell-groups to produce a combined page;
assigning LLR values to the bits of the combined page per zone and neighbor programming level; and
recovering the target page by applying to the bits of the combined page, with the assigned LLR values, soft decoding for decoding the ECC.

22. The method according to claim 21, and comprising holding predefined LLR values per zone and neighbor programming level in a table, wherein assigning the LLR values comprises retrieving the predefined LLR values from the table.

23. The method according to claim 21, wherein assigning the LLR values comprises calculating the LLR values for bits read from the memory cells in the cell-groups.

* * * * *